(12) United States Patent
Kim

(10) Patent No.: US 12,241,930 B2
(45) Date of Patent: Mar. 4, 2025

(54) WAFER TEST SYSTEM AND OPERATING METHOD THEREOF

(71) Applicant: SK hynix Inc., Icheon-si (KR)

(72) Inventor: Dong Kil Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 125 days.

(21) Appl. No.: 18/052,538

(22) Filed: Nov. 3, 2022

(65) Prior Publication Data

US 2023/0384365 A1 Nov. 30, 2023

(30) Foreign Application Priority Data

May 31, 2022 (KR) .................. 10-2022-0067144

(51) Int. Cl.
*G01R 31/28* (2006.01)
*G01K 3/00* (2006.01)
*G01K 3/08* (2006.01)
*G01R 1/073* (2006.01)

(52) U.S. Cl.
CPC ......... *G01R 31/2874* (2013.01); *G01K 3/005* (2013.01); *G01K 3/08* (2013.01); *G01R 1/07342* (2013.01)

(58) Field of Classification Search
CPC ............ G01R 31/2874; G01R 31/2831; G01R 31/2879; G01R 31/3004; G01R 1/07342; G01K 3/005; G01K 3/38
See application file for complete search history.

(56) References Cited

U.S. PATENT DOCUMENTS

| | | | |
|---|---|---|---|
| 2002/0039800 A1* | 4/2002 | Yamamoto | G11C 29/006 257/48 |
| 2002/0053065 A1 | 5/2002 | Mitsutake et al. | |
| 2003/0085723 A1* | 5/2003 | Martens | G01R 1/07342 324/754.07 |
| 2003/0146761 A1 | 8/2003 | Pakdaman et al. | |
| 2007/0063721 A1* | 3/2007 | Dozier | G01R 31/2889 324/754.03 |
| 2009/0289253 A1* | 11/2009 | Pendse | H01L 22/32 438/18 |
| 2014/0203837 A1* | 7/2014 | Minemier | G01R 31/3025 324/762.03 |
| 2017/0102410 A1* | 4/2017 | Takesako | G01R 1/06794 |
| 2018/0048169 A1* | 2/2018 | Bello | H01L 21/6773 |
| 2020/0266886 A1* | 8/2020 | Corzine | G01J 5/602 |
| 2022/0178993 A1* | 6/2022 | Lee | G01J 5/0007 |

FOREIGN PATENT DOCUMENTS

KR 10-2019-0132474 A 11/2019

\* cited by examiner

*Primary Examiner* — Dominic E Hawkins

(57) ABSTRACT

A wafer test system includes a chuck for supporting a wafer including a plurality of dies, a probe head for inputting a test signal for an electrical test to the probe card and receiving an electrical test result corresponding to the test signal, a probe card for inputting test signals to the dies through a plurality of pins and receiving test result, a sensing device mounted on the surface of the probe card, for sensing an active state occurring in the wafer when the electrical test is performed, and a determination unit for receiving the electrical test result and the active state information for the dies and determining whether each of the dies has failed using the result of the electrical test on the wafer and active state information.

12 Claims, 10 Drawing Sheets

WAFER TEST SYSTEM AND OPERATING METHOD THEREOF

CROSS-REFERENCE TO RELATED APPLICATION

The present application claims priority under 35 U.S.C. § 119(a) to Korean Patent Application No. 10-2022-0067144 filed in the Korean Intellectual Property Office on May 31, 2022, which is incorporated herein by reference in its entirety.

BACKGROUND

1. Technical Field

Various embodiments generally relate to a wafer test system and an operating method thereof.

2. Related Art

Semiconductor integrated circuits are manufactured in the form of dies on a semiconductor wafer, after which the dies are cut and individually packaged. In order to prevent dies that fail from being packaged, a wafer test is performed on the wafer on which the semiconductor integrated circuits are formed before packaging. When the wafer test is performed, a current or a test signal is applied to each semiconductor integrated circuit to determine whether the semiconductor integrated circuit operates according to its designed purpose.

Although semiconductor integrated circuits pass the wafer test, some of the packaged semiconductor integrated circuits may fail tests performed after packaging, or may fail during actual use. In order to improve the quality of semiconductor products, a wafer test with capable of determining a high percentage of semiconductor integrated circuits that may fail is desirable.

SUMMARY

Various embodiments are directed to a wafer test system having high die sorting capability, and a method for operating the same.

In an embodiment, a wafer test system may include: a chuck for supporting a wafer including a plurality of dies; a probe head for inputting a test signal for an electrical test to the probe card and receiving an electrical test result corresponding to the test signal; a probe card for inputting test signals to the dies through a plurality of pins and receiving test result; a sensing device mounted on the surface of the probe card, for sensing an active state occurring in the wafer when the electrical test is performed; and a determination unit for receiving the electrical test result and the active state information for the dies and determining whether each of the dies has failed using the result of the electrical test on the wafer and active state information.

In an embodiment, a method for operating a wafer test system may include: performing an electrical test on a wafer including a plurality of dies; sensing an active state occurring in the wafer when the electrical test is performed; and determining whether each of the plurality of dies included in the wafer has failed using a result of the electrical test on the wafer and active state information obtained in the sensing of the active state.

According to the embodiments of the present disclosure, it is possible to increase die sorting capability through a wafer test.

DETAILED DESCRIPTION

Hereinafter, embodiments of the present disclosure will be described in detail with reference to the accompanying drawings.

Figure 1:
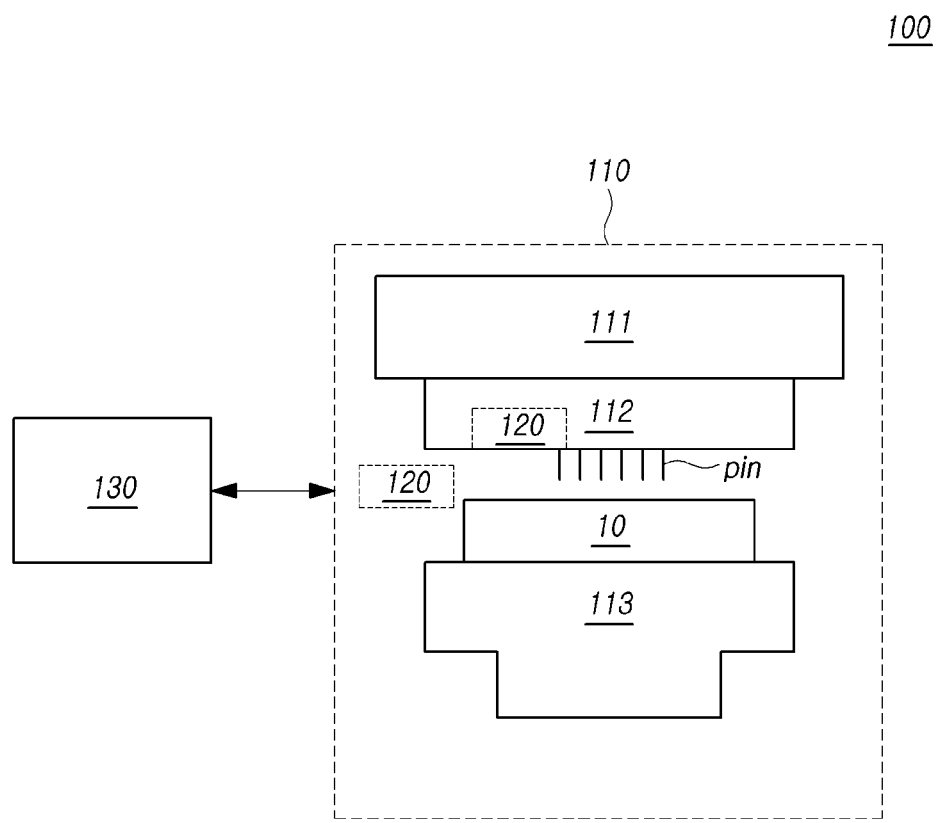
FIG. 1 is a schematic configuration diagram illustrating a wafer test system in accordance with embodiments of the present disclosure.

FIG. 1 is a schematic configuration diagram illustrating a wafer test system in accordance with embodiments of the present disclosure.

Referring to FIG. 1, a wafer test system 100 in accordance with embodiments of the present disclosure may include an electrical test device 110, a sensing device 120 and a determination unit 130.

The electrical test device 110 may apply a test signal, which is an electrical signal, to each die included in a test target wafer to measure electrical and electronic characteristics for determining whether each die operates as designed.

The electrical test device 110 may be a probe station that brings a pin into contact with a pad of a semiconductor integrated circuit to check electrical characteristics of the semiconductor integrated circuit.

The electrical test device 110 may include a probe head 111, a probe card 112 and a chuck 113.

The probe head 111 may input a test signal, received from a tester, to the probe card 112. The tester may generate the test signal for testing the electrical and electronic characteristics of the dies of the wafer. The tester may transmit the generated test signal through a cable connected to the probe head 111 and may receive a signal output from the probe head 111. The tester may include a power supply and a driver for generating the test signal.

The probe card 112 may be brought into contact with at least one die included in a wafer 10 to input the test signal to the die.

The probe card 112 may include a plurality of pins, and the pins of the probe card 112 may be brought into contact with pads disposed in the die.

The probe card 112 may be replaced with a new probe card 112 according to the type of wafer or test environment, or when the probe card 112 is worn or malfunctions.

The chuck 113 supports the wafer 10 when an electrical test is performed on the wafer 10.

The electrical test performed by the electrical test device 110 on a plurality of dies included in the wafer 10 may include at least one of a DC test, an AC test, a stress test, a cell test and a peripheral test.

The DC test is a test in which a DC current is applied to a die that is the test target for evaluation, for which a result of the test may be expressed as a current or a voltage.

The AC test is a test in which an AC current is applied to a die in a test target to evaluate dynamic characteristics related to timing, such as input/output switching time.

The stress test, also referred to as a burn-in test, is a test in which a high temperature and a high voltage are applied to a die to induce a potential fail of the die to determine in advance whether a fail is likely to occur early before the expected life of the die.

The cell test is a test in which a test pattern is written to or read from memory cells to determine whether the memory cells operate normally.

The peripheral test is a test to determine whether a peripheral circuit that is disposed in a die functions normally.

The sensing device 120 may sense an active state occurring in the wafer 10 when the electrical test device 110 performs an electrical test on the wafer 10.

When a current flows through a die included in the wafer 10, a heat dissipation or light emission phenomenon may occur in the die. The sensing device 120 may sense the heat dissipation or light emission as indicators of an active state and transmit active state information to the determination unit 130. Active state information may be data on the distribution and intensities of active states in the wafer 10.

As an example, the active state information may be data or a thermal image regarding a temperature distribution of the wafer 10.

When an electrical test is performed on a plurality of dies included in the wafer 10, an active state occurring in the wafer 10 may be light emission. The sensing device 120 may include an InGaAS sensor to sense light emission. In order for the sensing device 120 to sense light emission, a darkroom condition in which external light is blocked may be required.

On the other hand, an active state occurring in the wafer 10 may be heat dissipation. The sensing device 120 may include an InSb sensor to sense heat dissipation. A darkroom is not required for the sensing device 120 to sense heat dissipation occurring in the wafer 10.

The sensing device 120 may be a thermal sensing element, a thermal sensing camera or a light emission sensing element mounted on the surface of the probe card 112 through a surface mount technology. In another example, the sensing device 120 may be mounted on the support (not shown) on the side of the chuck 113 included in the test device 110 to detect heat dissipation.

The determination unit 130 may receive the electrical test result from the electrical test device 110 and the active state information from the sensing device 120. By processing the electrical test result and the active state information, the determination unit 130 may determine whether each of the plurality of dies included in the wafer 10 has failed. The determination unit 130 may include a Host PC including a processor and a memory. Firmware or software for determining whether each of the plurality of dies has failed may be uploaded to the memory. The Processor may execute firmware or software loaded on the memory. The processor may determine whether each of the dies has failed based on the electrical test result and the active state information.

The determination unit 130 may include the host PC that determines whether the dies fail and the tester that generates the test signal and receives the electrical test result and the active state information.

The determination unit 130 may have high die sorting capability by using, for die sorting, the temperature or active state of the wafer 10 sensed when the electrical test device 110 applies a test signal to the dies included in the wafer 10.

For example, by comparing the electrical test result and the active state information with reference data, even if a die passes the electrical test, the die can be sorted as a fail when the comparison of the active state information to reference data for fail determination exceeds a threshold difference. Therefore, the wafer test system 100 may determine a potential fail possibility that would not be determined only by the electrical test result, and as a result the die sorting capability of the wafer test system may be improved.

Figure 2:
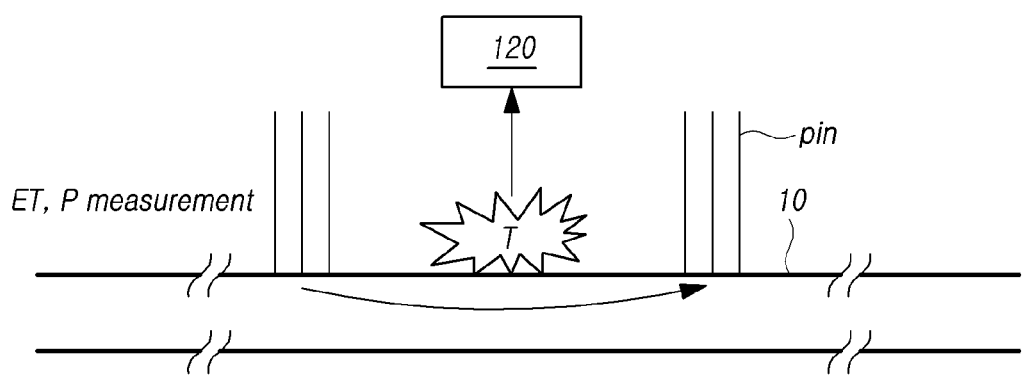
FIG. 2 is a diagram schematically illustrating an electrical test in accordance with embodiments of the present disclosure.

FIG. 2 is a diagram schematically illustrating an electrical test in accordance with embodiments of the present disclosure.

Referring to FIGS. 1 and 2, when an electrical test is performed, a sensing device 120 may sense an active state of a wafer 10 by a current flowing through a die.

As described above, when an electrical test ET is performed, the pin of the probe card 112 may be brought into contact with a pad disposed in the die. The probe card 112 may apply a test signal, received from the probe head 111, to a semiconductor integrated circuit of the die through the pin and the pad.

The electrical test device 110 may measure a characteristic parameter P of the die. a result of the electrical test ET may be the characteristic parameter P. The Characteristic parameter P may vary depending on the items of an electrical test. For example, When the test item is a DC test, the characteristic parameter P may be an input/output voltage or input/output current. When the item is an AC test, the characteristic parameter P may be related to timing, such as time or period. When the test item is a function test such as a cell test or a peripheral test, the characteristic parameter P may be a fail bit count.

Meanwhile, as described above, when the electrical test ET is performed on a die included in the wafer 10, a current may flow through the semiconductor integrated circuit of the die. When a current flows through the semiconductor integrated circuit, a heat dissipation phenomenon or a light emission phenomenon may occur due to the heat generated by the current.

The determination unit 130 may determine whether the die has failed by combining the characteristic parameter P and a temperature T of the die included in the wafer 10 and comparing the combination to reference values.

Figure 3:
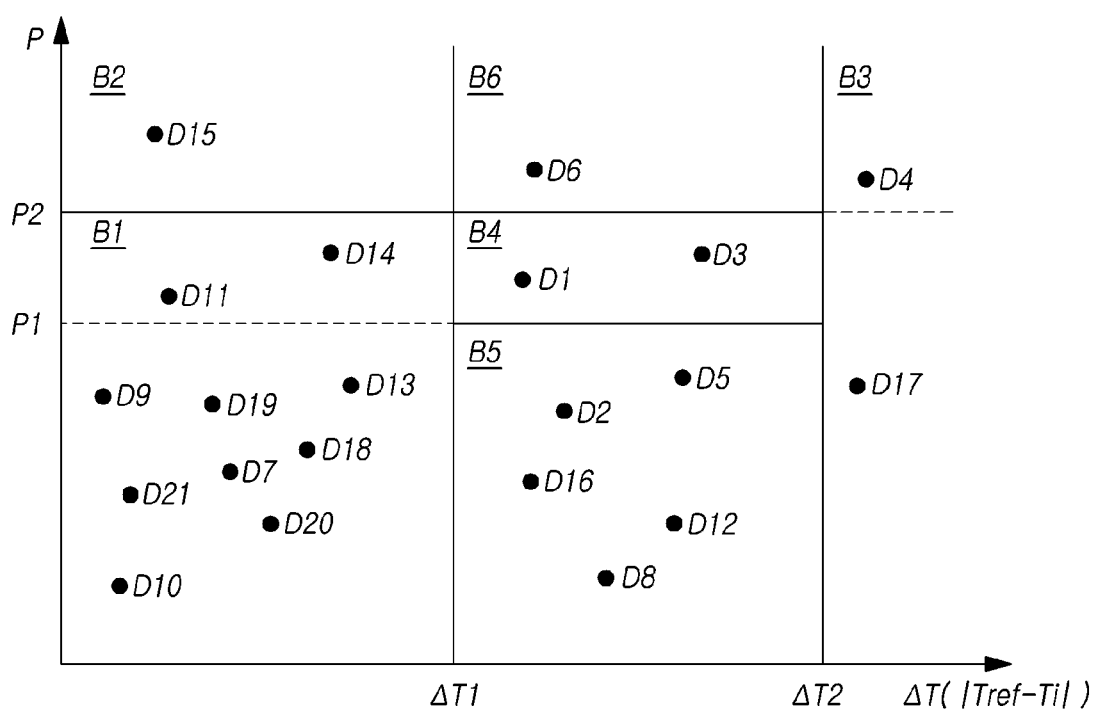
FIG. 3 is a diagram illustrating a wafer test result in accordance with embodiments of the present disclosure.

FIG. 3 is a diagram illustrating a wafer test result in accordance with embodiments of the present disclosure.

Figure 4:
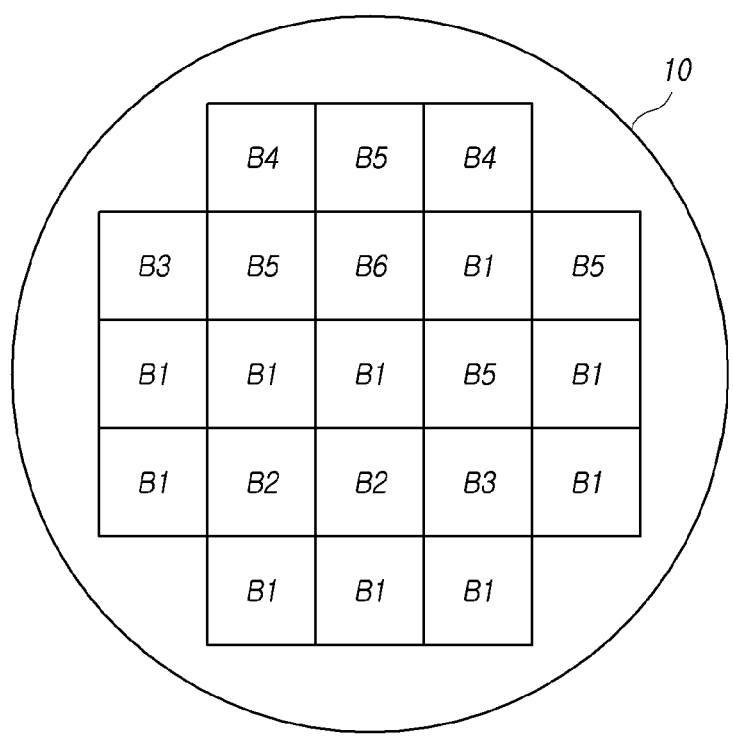
FIG. 4 is a diagram illustrating a result of classifying dies included in a wafer into a plurality of categories according to wafer test results in accordance with the embodiments of the present disclosure.

FIG. 4 is a diagram illustrating a result of classifying dies included in a wafer into a plurality of categories according to wafer test results in accordance with the embodiments of the present disclosure.

Referring to FIGS. 3 and 4, a determination unit 130 may classify the plurality of dies included in a wafer 10 into a plurality of categories on the basis of the characteristic parameter P, which is a result of an electrical test, and the active state information of the wafer 10.

Categories may be associated with the bin codes assigned to the dies.

The P axis shown in FIG. 3 corresponds to a characteristic parameter value for each die, and the ΔT axis corresponds to a difference between a reference temperature Tref and a temperature Ti of a die.

Various numerical values may be used to reflect the characteristic parameter P for respective items of an electrical test. For example, the characteristic parameter P may be a fail bit count obtained through the cell test.

If categories are classified using only a result of an electrical test, by setting a threshold fail bit count, a die is determined to be a pass for a wafer test when a fail bit count is smaller than the threshold fail bit count, and a die is determined to be a fail for a wafer test when a fail bit count is equal to or larger than the threshold fail bit count.

For example, the determination unit 130 may determine that a die having a fail bit count smaller than P2, which is the threshold fail bit count, is a pass and a die having a fail bit count equal to or larger than P2 is a fail.

Die sorting capability and accuracy can be improved, however, by classifying the dies included in the wafer 10 into a plurality of categories on the basis of a combination of an electrical test result and active state information.

For example, a reference temperature Tref may be set while performing an electrical test using a known good die (KGD). The reference temperature Tref may be set for each type of an electrical test.

Dies that have passed an electrical test process but are determined to be fails in a test subsequently performed, or that are determined to be fails in reliability evaluation, may be checked for a difference from the reference temperature Tref during an electrical test. Dies may be sorted into categories on the basis of a temperature difference.

Referring to FIG. 3, even though dies have fail bit counts smaller than P2, dies whose fail bit counts are equal to or larger than P1 and whose differences from the reference temperature Tref are equal to or larger than ΔT1 and smaller than ΔT2 may still be in a category of dies known to be prone to fails. P1 is different value from P2, which is a new threshold to subdivide the die through combination with temperature.

By classifying dies into categories using only results of an electrical test, for example with P2 set as the threshold fail bit count, dies D15, D6 and D4 are classified into one category and determined to be failed, and the other dies are classified into another category of dies that are not determined to be failed.

In an embodiment, when a die is classified by combining a characteristic parameter P and active state information, dies can be more accurately sorted. For example, a die whose fail bit count is smaller than P2 and whose temperature has a difference from the reference temperature Tref smaller than ΔT1 may be classified into a first category B1, and a die whose fail bit count is equal to or larger than P2 and whose temperature has a difference from the reference temperature Tref smaller than ΔT1 may be classified into a second category B2.

Regardless of a fail bit count, a die whose temperature has a difference from the reference temperature Tref equal to or larger than ΔT2 may be classified into a third category B3.

A die whose fail bit count is smaller than P2 and equal to or larger than P1 and whose temperature has a difference from the reference temperature Tref equal to or larger than ΔT1 and smaller than ΔT2 may be classified into a fourth category B4.

A die whose fail bit count is smaller than P1 and whose temperature has a difference from the reference temperature Tref equal to or larger than ΔT1 and smaller than ΔT2 may be classified into a fifth category B5.

The remaining dies may be classified into a sixth category B6.

In this example, dies D1 and D3 corresponding to the fourth category B4 may be categorized as fails using characteristic parameters and active state information, but would not be categorized as fails if only using characteristic parameters after an electrical test.

P2 is the reference value set when sorting dies based only on characteristic parameter P. P1, ΔT1 and ΔT2 are reference values set when sorting dies based on combination of characteristic Parameter P and active state information. P1, ΔT1 and ΔT2 may be determined by tracking the results of other tests after the wafer test, such as the package test and the module test. The above-described method of sorting dies into categories is only an example for describing the present disclosure. When dies are sorted into various categories to improve the die screen ability in wafer testing through empirical testing and standard setting, various characteristic parameters according to test items and corresponding active state information may be utilized, and a threshold range for classifying categories may also be set in various ways.

As shown in FIG. 4, the determination unit 130 may generate a wafer bin map in which a category corresponding to each die is indicated. The wafer bin map may be used in analysis of a semiconductor process.

Figure 5:
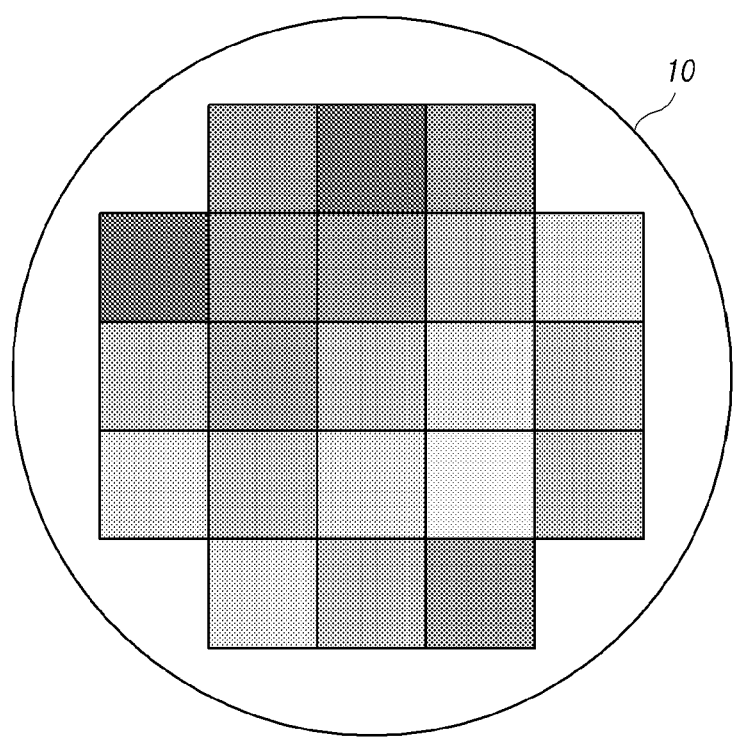
FIG. 5 is a diagram illustrating a wafer temperature distribution map in accordance with embodiments of the present disclosure.

FIG. 5 is a diagram illustrating a wafer temperature distribution map in accordance with embodiments of the present disclosure.

Referring to FIG. 5, a determination unit 130 may generate a temperature distribution map for a wafer 10 on the basis of active state information.

A wafer map is an image that visualizes and shows a result of a wafer test, and may be used for quality management of semiconductor integrated circuits, such as sorting failed wafers or figuring out a process related with a quality issue.

The determination unit 130 may generate a wafer 1o temperature distribution map by processing active state information obtained while performing an electrical test on the wafer 10.

The wafer temperature distribution map may indicate a temperature visualized for each die as shown in FIG. 5, and it will be understood that the visualization may be continuously indicated for an entire wafer instead of in the graphical schematic illustration of FIG. 5.

The electrical test device 110 may perform various types of electrical tests on the wafer 10, and the determination unit 130 may generate a wafer temperature distribution map for each type of electrical test.

Figure 6:
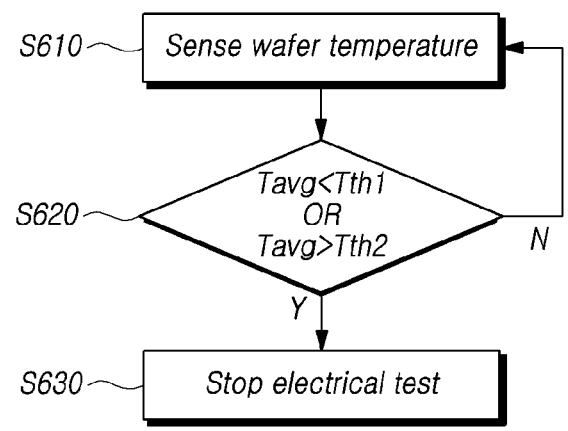
FIG. 6 is a flowchart illustrating an electrical test stopped on the basis of temperatures of dies included in a wafer in accordance with embodiments of the present disclosure.

FIG. 6 is a flowchart illustrating an electrical test stopped on the basis of temperatures of dies included in a wafer in accordance with embodiments of the present disclosure.

Figure 7:
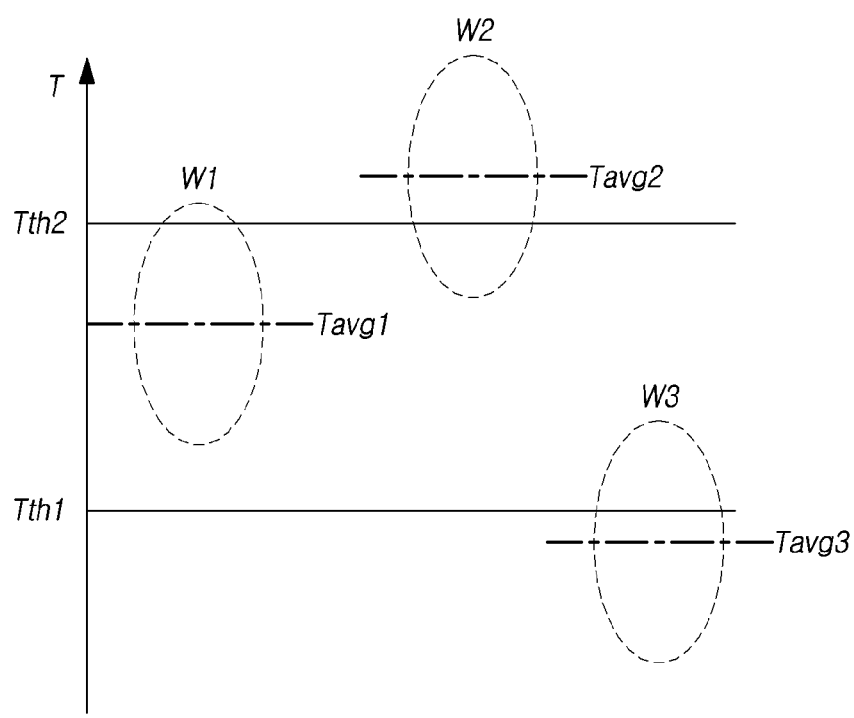
FIG. 7 is a diagram illustrating temperature distributions of dies included in the wafer of FIG. 6.

FIG. 7 is a diagram illustrating temperature distributions of dies included in the wafer of FIG. 6.

Referring to FIGS. 6 and 7, the determination unit 130 may stop an electrical test when an average temperature Tavg of the plurality of dies included in the wafer 10 is lower than a first threshold temperature Tth1 or higher than a second threshold temperature Tth2, which is higher than the first threshold temperature Tth1.

The electrical test device 110 may perform an operation designated by the settings of an installed software program.

In an embodiment, errors in the programming, which may result from human error, of the electrical test device 110 may be detected in real time using active state information, such as for example, temperature distributions. For example, when the program of the electrical test device 110 is incorrect, test signals inputted to the wafer 10 through the probe card 112 may result in the wafer 10 having a temperature distribution different from an expected value. In such instances, the programming and settings may be checked in a package test to be performed after packaging or in an actual use unless the different setting is reflected on a yield, which is inefficient.

Detection of errors in the programming and settings of the electrical test device 110 may be detected more quickly and efficiently in embodiments of the disclosure. For example, when a test signal inputted to the wafer 10 is lower than the voltage usually used in the programming of the electrical test device 110 is normally set, the temperature distribution of the wafer 10 may be formed to be relatively low when an electrical test is performed.

Conversely, if the level of a test signal inputted to the wafer 10 is higher than normal, then the temperature distribution of the wafer 10 may be formed to be relatively higher when an electrical test is performed.

The determination unit 130 may compare the average temperature Tavg of the plurality of dies included in the wafer 10 with the first threshold temperature Tth1 or the second threshold temperature Tth2.

The first threshold temperature Tth1 and the second threshold temperature Tth2 may be set on the basis of a known good die.

When it is determined that the results from the testing of the electrical test device 110 exceeds threshold temperatures, the determination unit 130 may stop electrical tests on other wafers.

Through this, it is possible to screen a case in which the programming of the electrical test device 110 is set incorrectly before packaging and before the product is actually used.

Describing this according to the flowchart of FIG. 6, the electrical test device 110 may perform an electrical test on each of a plurality of wafers 10. When the electrical test is performed on the wafer 10, the sensing device 120 may sense temperatures of the plurality of dies included in the wafer 10 (S610).

The determination unit 130 may calculate the average temperature Tavg of the plurality of dies included in the wafer 10 on the basis of temperature information received from the sensing device 120, and may determine whether the average temperature Tavg is lower than the first threshold temperature Tth1 or higher than the second threshold temperature Tth2 (S620).

When the average temperature Tavg satisfies the condition at S620 (S620-Y), the determination unit 130 may stop electrical tests on the wafers 10 on which the electrical tests are not performed yet (S630).

When the average temperature Tavg does not satisfy the condition at S620 (S620-N), the electrical test device 110 may perform electrical tests on other wafers 10 on which the electrical tests are not performed, and the sensing device 120 may sense the temperature of the wafer 10 each time an electrical test is repeatedly performed (S610).

FIG. 7 illustrates temperature distributions of a first wafer W1, a second wafer W2 and a third wafer W3.

An average temperature Tavg1 of the first wafer W1 is lower than the second threshold temperature Tth2 and higher than the first threshold temperature Tth1. Accordingly, the electrical test device 110 may repeatedly perform an electrical test on a plurality of wafers. The sensing device 120 may sense temperatures generated while an electrical test is repeatedly performed on the plurality of wafers.

An average temperature Tavg2 of the second wafer W2 is higher than the second threshold temperature Tth2. Accordingly, the determination unit 130 may stop electrical tests on other wafers 10 on which the electrical tests are not performed.

An average temperature Tavg3 of the third wafer W3 is lower than the first threshold temperature Tth1. Accordingly, the determination unit 130 may stop electrical tests on other wafers 10 on which the electrical tests are not performed.

When an electrical test of the electrical test device 110 is stopped, it may be checked whether there is an abnormality in program settings. When it is determined that there is no abnormality in the program settings of the electrical test device 110, the stopped electrical test may be resumed.

Figure 8:
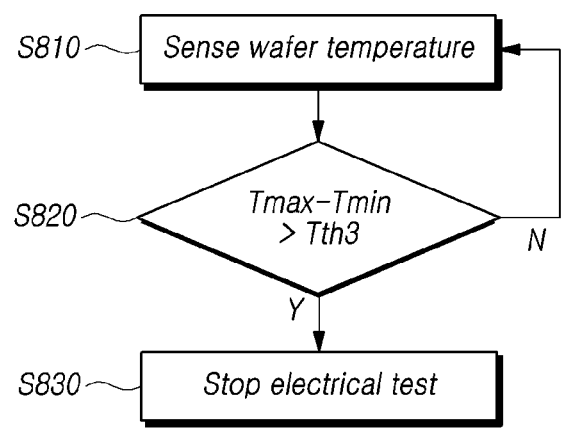
FIG. 8 is a flowchart illustrating an electrical test stopped on the basis of temperatures of dies included in a wafer in accordance with embodiments of the present disclosure.

FIG. 8 is a flowchart illustrating electrical test stopped on the basis of temperatures of dies included in a wafer in accordance with embodiments of the present disclosure.

Figure 9:
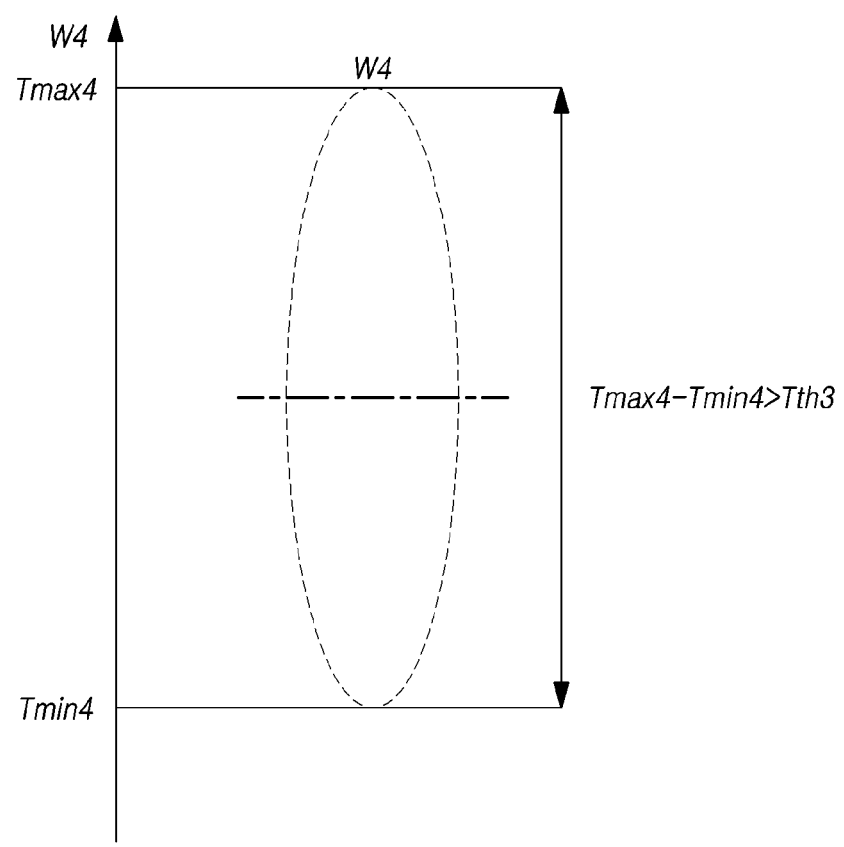
FIG. 9 is a diagram illustrating temperature distributions of dies included in the wafer of FIG. 8.

FIG. 9 is a diagram illustrating temperature distributions of dies included in the wafer of FIG. 8.

Referring to FIGS. 8 and 9, when the difference between a maximum temperature Tmax and a minimum temperature Tmin among temperatures of the plurality of dies included in the wafer 10 is equal to or higher than a third threshold value, the determination unit 130 may stop an electrical test.

As described above, when the program of the electrical test device 110 is set incorrectly, test signals inputted to the wafer 10 through the probe card 112 may vary, which may lead to a change in the temperature distribution of the wafer 10.

The determination unit 130 may determine whether the program of the electrical test device 110 is set incorrectly through the difference between the maximum temperature Tmax and the minimum temperature Tmin from among the resulting temperatures of the plurality of dies included in the wafer 10.

When it is determined that the program of the electrical test device 110 generates unexpected results, the determination unit 130 may stop electrical tests on other wafers on which the electrical tests are not performed.

Describing this according to the flowchart of FIG. 8, the electrical test device 110 may perform an electrical test on each of a plurality of wafers 10. While the electrical test is performed on the wafer 10, the sensing device 120 may sense temperatures of the plurality of dies included in the wafer 10 (S810).

The determination unit 130 may calculate the difference between the maximum temperature Tmax and the minimum temperature Tmin among the temperatures of the plurality of dies included in the wafer 10 using temperature information received from the sensing device 120, and may determine whether the difference between the maximum temperature Tmax and the minimum temperature Tmin is equal to or higher than the third threshold value Tth3 (S820).

The third threshold value Tth3 may be set on the basis of a known good die.

When the difference between the maximum temperature Tmax and the minimum temperature Tmin satisfies the condition at S820 (S820-Y), the determination unit 130 may stop the electrical test (S830).

When the difference between the maximum temperature Tmax and the minimum temperature Tmin does not satisfy the condition at S820 (S820-N), the electrical test device 110 may repeatedly perform an electrical test on other wafers 10 on which the electrical test is not performed, and the sensing device 120 may sense the temperature of the wafer 10 each time the electrical test is repeatedly performed (S810).

FIG. 9 illustrates a temperature distribution of a fourth wafer W4.

The difference between a maximum temperature Tmax4 and a minimum temperature Tmin4 of the fourth wafer S4 is higher than the third threshold value Tth3. Accordingly, the determination unit 130 may stop an electrical test on a next wafer.

As described above with reference to FIGS. 6 and 7, when an electrical test of the electrical test device 110 is stopped, program settings may be checked for abnormalities. When there is no abnormality in the program setting of the electrical test device 110, the electrical tests may be resumed.

Figure 10:
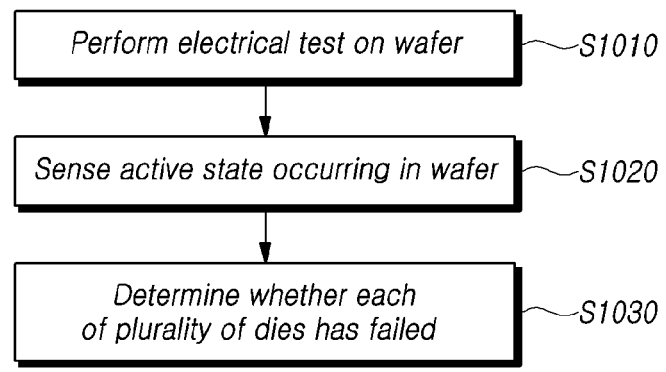
FIG. 10 is a flowchart illustrating a method for operating a wafer test system in accordance with embodiments of the present disclosure.

FIG. 10 is a flowchart illustrating a method for operating a wafer test system 100 in accordance with embodiments of the present disclosure.

Referring to FIG. 10, a method for operating the wafer test system 100 may include performing an electrical test on a wafer including a plurality of dies (S1010).

The electrical test may include at least one of a DC test, an AC test, a stress test, a cell test and a peripheral test.

The method for operating the wafer test system 100 may include sensing an active state occurring in the wafer when performing the electrical test (S1020).

The active state may be light emission.

The active state may be heat dissipation.

The method for operating the wafer test system 100 may include determining whether each of the plurality of dies included in the wafer has failed (S1030), on the basis of a result of the electrical test on the wafer and active state information obtained at the step S1020 of sensing the active state.

The method for operating the wafer test system 100 may further include classifying the plurality of dies included in the wafer into a plurality of categories on the basis of characteristic parameters as the result of the electrical test on the wafer and the active state information.

In addition, the method for operating the wafer test system 100 may further include generating a wafer temperature distribution map for the wafer on the basis of the active state information.

Moreover, the method for operating the wafer test system 100 may further include stopping electrical tests based on temperatures of the plurality of dies included in the wafer.

At the step of stopping the electrical test (not illustrated), the electrical test may be stopped when the average temperature of the plurality of dies included in the wafer is lower than a first threshold temperature or higher than a second threshold temperature higher than the first threshold temperature.

Meanwhile, at the step of stopping the electrical test, the electrical test may be stopped when the difference between a maximum temperature and a minimum temperature among temperatures of the plurality of dies included in the wafer is equal to or higher than a third threshold value.

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A wafer test system comprising:
a chuck for supporting a wafer including a plurality of dies;
a probe head for inputting a test signal for an electrical test to a probe card and receiving an electrical test result corresponding to the test signal;
the probe card for inputting test signals to the dies through a plurality of pins and receiving test results;
a sensing device mounted on a surface of the probe card, for sensing an active state occurring in the wafer when the electrical test is performed; and
a determination unit for receiving the electrical test result and an active state information for the dies and determining whether each of the dies has failed using the result of the electrical test on the wafer and the active state information,
wherein the determination unit stops the electrical test based on the active state information of the plurality of dies,
wherein the active state information is an average temperature of the plurality of dies included in the wafer that is lower than a first threshold temperature or higher than a second threshold temperature, where the second threshold temperature is higher than the first threshold temperature, or
wherein the active state information is a difference between a maximum temperature and a minimum temperature from among temperatures of the plurality of dies included in the wafer that is equal to or higher than a threshold value.

2. The wafer test system according to claim 1, wherein the determination unit classifies the plurality of dies into a plurality of categories using characteristic parameters resulting from the electrical test on the wafer and the active state information.

3. The wafer test system according to claim 1, wherein the determination unit generates a wafer temperature distribution map for the wafer using the active state information.

4. The wafer test system according to claim 1, wherein the active state is light emission.

5. The wafer test system according to claim 1, wherein the active state is heat dissipation.

6. The wafer test system according to claim 1, wherein the electrical test includes at least one of a DC test, an AC test, a stress test, a cell test and a peripheral test.

7. A method for operating a wafer test system, comprising:
performing an electrical test on a wafer including a plurality of dies;
sensing an active state occurring in the wafer when the electrical test is performed;
determining whether each of the plurality of dies included in the wafer has failed using a result of the electrical test on the wafer and active state information obtained in the sensing of the active state; and
stopping the electrical test based on temperatures of the plurality of dies included in the wafer,
wherein the electrical test is stopped when an average temperature of the plurality of dies included in the wafer is lower than a first threshold temperature or higher than a second threshold temperature, which is higher than the first threshold temperature, or
wherein, in the stopping of the electrical test, the electrical test is stopped when a difference between a maximum temperature and a minimum temperature among the temperatures of the plurality of dies included in the wafer is equal to or higher than a threshold value.

8. The method according to claim 7, further comprising: classifying the plurality of dies included in the wafer into a plurality of categories using characteristic parameters resulting from the electrical test on the wafer and the active state information.

9. The method according to claim 7, further comprising: generating a wafer temperature distribution map for the wafer using the active state information.

10. The method according to claim 7, wherein the active state is light emission.

11. The method according to claim 7, wherein the active state is heat dissipation.

12. The method according to claim 7, wherein the electrical test includes at least one of a DC test, an AC test, a stress test, a cell test and a peripheral test.

* * * * *